US007674675B2

(12) United States Patent
Berndlmaier et al.

(10) Patent No.: US 7,674,675 B2
(45) Date of Patent: Mar. 9, 2010

(54) METHOD OF FORMING AN INTEGRATED SOI FINGERED DECOUPLING CAPACITOR

(75) Inventors: Zachary E. Berndlmaier, Newburgh, NY (US); Edward W. Kiewra, Verbank, NY (US); Carl J. Radens, LaGrangeville, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 668 days.

(21) Appl. No.: 11/485,599

(22) Filed: Jul. 12, 2006

(65) Prior Publication Data

US 2006/0252226 A1 Nov. 9, 2006

Related U.S. Application Data

(62) Division of application No. 10/710,256, filed on Jun. 29, 2004, now Pat. No. 7,102,204.

(51) Int. Cl.
*H01L 21/8242* (2006.01)

(52) U.S. Cl. ................. 438/243; 438/386; 257/302; 257/E21.651

(58) Field of Classification Search ............ 438/242, 438/243, 386; 257/302, E21.651
See application file for complete search history.

(56) References Cited

U.S. PATENT DOCUMENTS

| | | | |
|---|---|---|---|
| 4,983,544 A * | 1/1991 | Lu et al. ............. 438/698 |
| 5,206,787 A | 4/1993 | Fujioka | |
| 5,304,506 A | 4/1994 | Porter et al. | |
| 5,661,340 A | 8/1997 | Ema et al. | |
| 5,688,709 A | 11/1997 | Rostoker | |
| 5,759,907 A * | 6/1998 | Assaderaghi et al. ........ 438/386 |
| 5,770,875 A | 6/1998 | Assaderaghi et al. | |
| 5,789,289 A | 8/1998 | Jeng | |
| 5,872,697 A | 2/1999 | Christensen et al. | |
| 6,015,729 A | 1/2000 | Shirley et al. | |
| 6,081,008 A | 6/2000 | Rostoker | |
| 6,096,584 A | 8/2000 | Ellis-Monaghan et al. | |
| 6,124,163 A | 9/2000 | Shirley et al. | |
| 6,188,122 B1 | 2/2001 | Davari et al. | |
| 6,303,457 B1 | 10/2001 | Christensen et al. | |
| 6,337,253 B1 | 1/2002 | Davari et al. | |
| 6,475,838 B1 | 11/2002 | Bryant et al. | |
| 6,492,244 B1 | 12/2002 | Christensen et al. | |
| 6,541,347 B2 * | 4/2003 | Tsai et al. ............. 438/392 |
| 6,552,381 B2 | 4/2003 | Chittipeddi et al. | |
| 6,608,365 B1 | 8/2003 | Li et al. | |
| 6,963,483 B2 | 11/2005 | Chakravorty et al. | |
| 2002/0036322 A1 | 3/2002 | Divakauni et al. | |
| 2002/0064913 A1* | 5/2002 | Adkisson et al. ............ 438/241 |
| 2002/0066916 A1* | 6/2002 | Hsu et al. ............. 257/301 |
| 2003/0094654 A1 | 5/2003 | Christensen et al. | |
| 2003/0116531 A1* | 6/2003 | Kamins et al. ............. 216/41 |

* cited by examiner

*Primary Examiner*—Steven J Fulk
(74) *Attorney, Agent, or Firm*—Gibb I.P. Law Firm, LLC; Steven Capella, Esq.

(57) ABSTRACT

The invention provides a fingered decoupling capacitor in the bulk silicon region that are formed by etching a series of minimum or sub-minimum trenches in the bulk silicon region, oxidizing these trenches, removing the oxide from at least one or more disjoint trenches, filling all the trenches with either in-situ doped polysilicon, intrinsic polysilicon that is later doped through ion implantation, or filling with a metal stud, such as tungsten and forming standard interconnects to the capacitor plates.

13 Claims, 16 Drawing Sheets

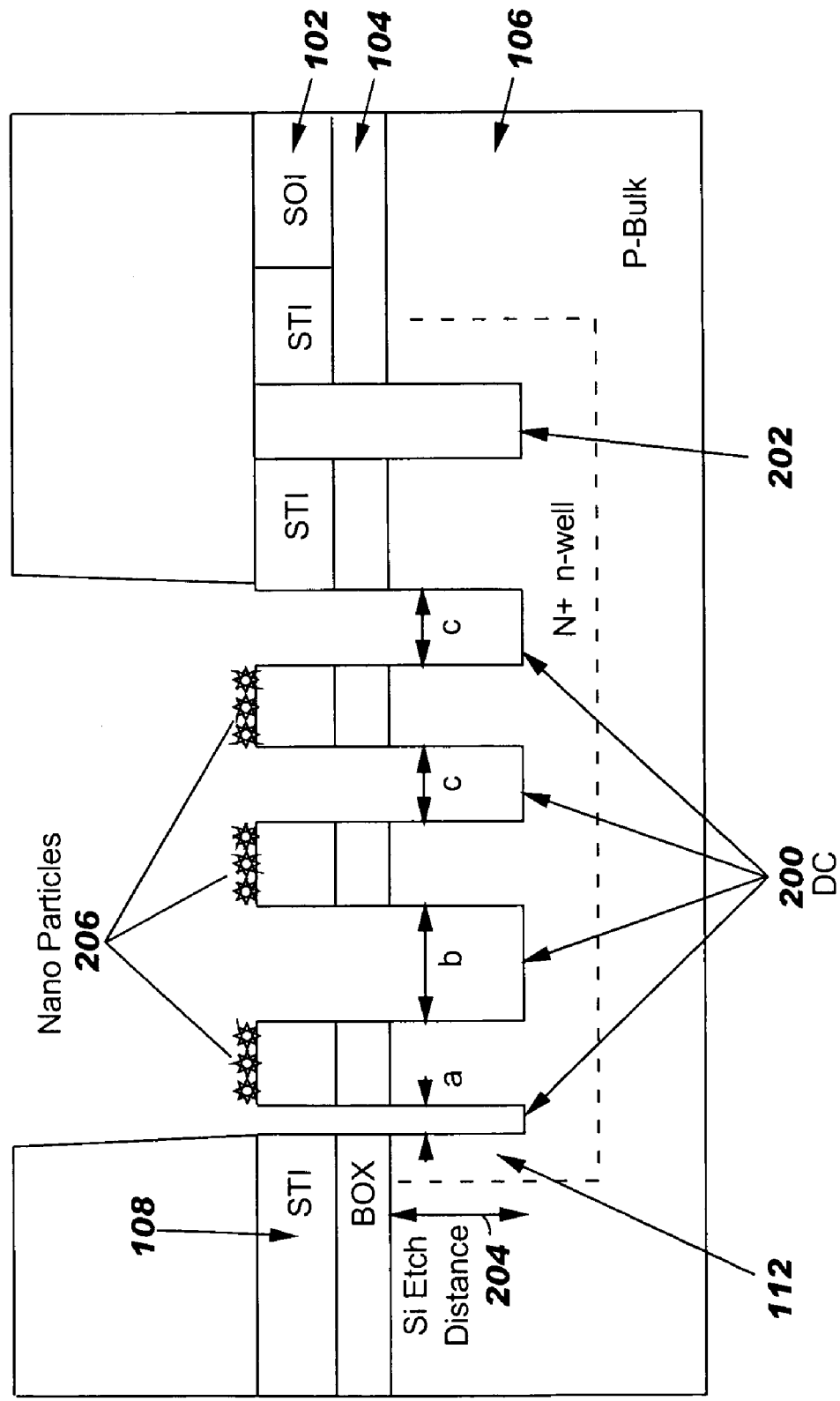

METHOD OF FORMING AN INTEGRATED SOI FINGERED DECOUPLING CAPACITOR

CROSS-REFERENCE TO RELATED APPLICATIONS

This application is a division of U.S. application Ser. No. 10/710,256 filed Jun. 29, 2004 now U.S. Pat. No. 7,102,204.

BACKGROUND OF THE INVENTION

1. Field of the Invention

The invention generally relates to silicon-on-insulator (SOI) integrated structures and more particularly to an SOI structure that has at least one decoupling capacitor that includes capacitive fingers extending into the non-active bulk region of the SOI structure, where the bulk region is normally only used as a support region and does not normally contain devices.

2. Description of the Related Art

High performance circuits require high-value, low-impedance decoupling capacitors between the DC power supply and ground lines to limit noise created by rapid switching of current. As known, this noise can arise, for example, due to inductive and capacitive parasitics. The noise problem is particularly a concern for mixed-mode products (analog/digital), where it is necessary to work with very low signals.

Ideally, the decoupling capacitors are placed as close as possible to the load in order to enhance their effectiveness in reducing the noise in power and ground lines. Consequently, decoupling capacitors have been fabricated directly on the chip.

However, for SOI or bulk MOS high performance circuits, the resistance of inversion capacitors is excessively high (>5 K-ohm/sq) for decoupling of high frequency noise because of the inversion layer resistance, which is representative of coupling impedance. On the other hand, although accumulation capacitors are effective in bulk MOS, they are not a viable option for SOI because of the high resistance of the thin silicon layer on insulator. Due to other device considerations, such thinner SOI layers are constantly being sought, which aggravates the decoupling capacitor problem. Also, planar junction capacitances are not practical for SOI because of very low SOI to substrate capacitance. None of the silicon based decoupling capacitor approaches commonly practiced for bulk MOS technologies prior to this invention provide a fully acceptable solution for high performance SOI circuits. Other solutions such as metal insulator metal capacitors (MiM cap) are available, but these do not provide high capacitance per unit area, and they use valuable wire tracks in the metal layers which are not desirable.

SUMMARY OF THE INVENTION

The invention provides a fingered decoupling capacitor in the bulk silicon region that is formed by etching a series of minimum or sub-minimum trenches in the bulk silicon region, oxidizing these trenches, and removing the oxide from one or more of the disjoint trenches. The invention then fills all the trenches with either in-situ doped polysilicon, intrinsic polysilicon that is later doped through ion implantation, or a metal stud, such as tungsten. Next, the invention forms standard interconnects to the capacitor plates.

More specifically, the invention forms a silicon-on-insulator integrated structure, that comprises at least one active region of active devices, and at least one bulk region adapted to provide structural support to the active region. The invention first protects the active region with a first mask and dopes the unprotected bulk region to form a common lower plate in the bulk region below areas where capacitive fingers will be formed. The invention then forms a second mask used to pattern the capacitive fingers. This second mask can be a conventional photolithographic mask or can be formed by depositing self-assembling nanoparticles on the bulk region as the second mask. After this, the finger openings are patterned (e.g., by etching, etc.) into the bulk region through the second mask. The finger openings are then lined with an insulator and filled with a conductor to form the capacitive fingers that extend into the bulk region.

These capacitive fingers extend vertically into the bulk region, in a direction perpendicular to the horizontal upper surface of the bulk region. The insulator within the capacitive fingers is formed separately from gate insulators of transistors in the active area, which allows the insulator to be made of a different material and of a different thickness than the gate insulators.

Next, a common upper plate is formed. The common upper plate is connected to the conductors within the capacitive fingers and can be formed to extend from the decoupling capacitor into the active region. For example, the decoupling capacitor can be connected to a transistor such that the decoupling capacitor comprises a storage element of a dynamic random access memory (DRAM) memory element.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which:

FIGS. 2A-2C are cross-sectional schematic diagrams of a partially completed SOI structure;

DETAILED DESCRIPTION OF PREFERRED EMBODIMENTS OF THE INVENTION

Figure 1A:
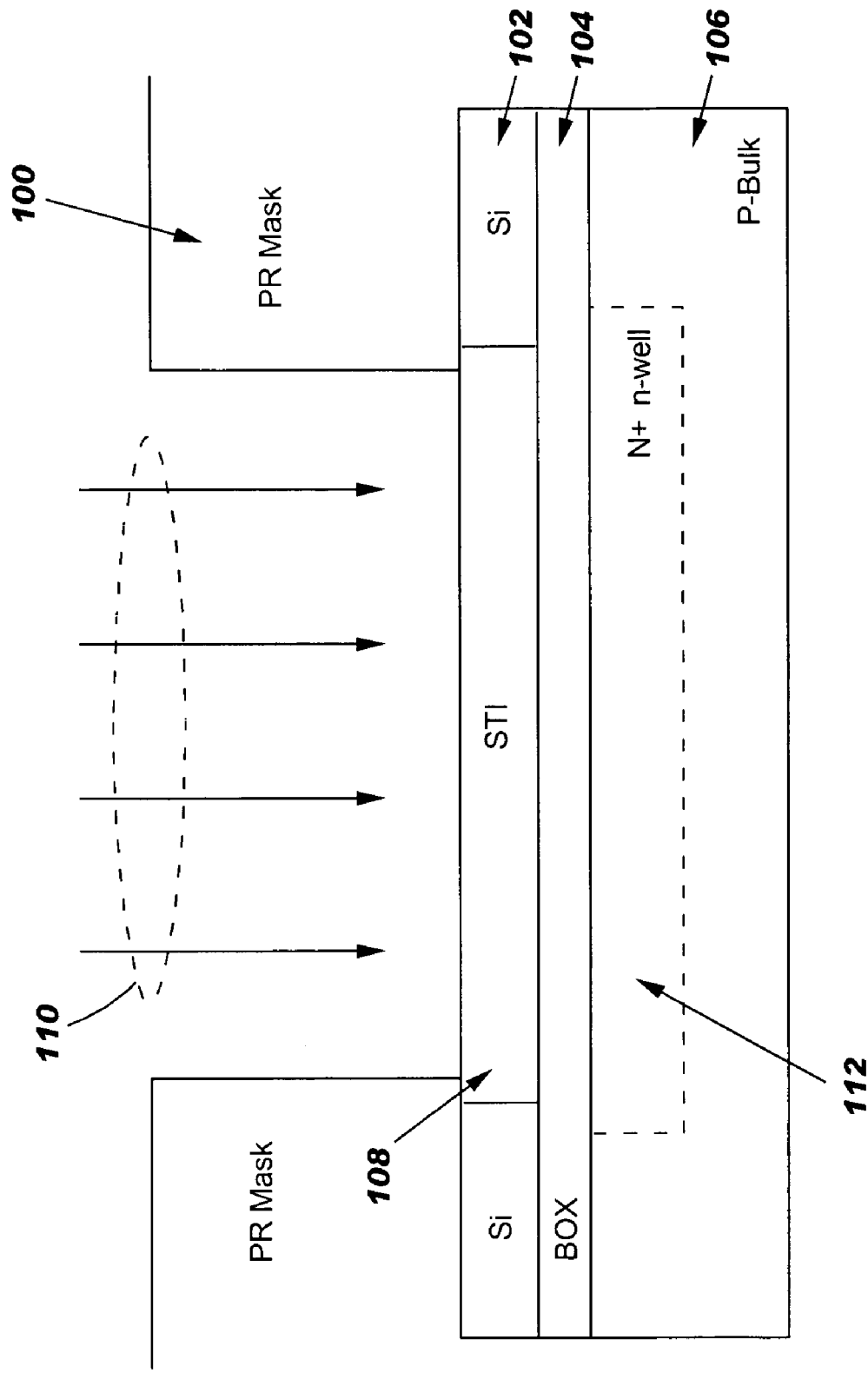
FIG. 1A is a cross-sectional schematic diagram of a partially completed SOI structure.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

The present invention provides integrated high capacitance structures in the SOI bulk region of an SOI semiconductor structure. The invention allows the capacitor plate contacts to be connected through or to the active SOI region, thus affording standard metal processing to enable the use of the capacitor. The invention positions the capacitive elements completely in the bulk region so as to not have influence to or from the active SI layer. The capacitor can utilize the standard SOI device gate oxide of the transistors that are formed in the active region or a can have unique (thicker or thinner) decoupling capacitor oxide. The capacitor can be fabricated using standard photolithography, or the capacitor can be fabricated using self-assembled minimum feature structures (e.g., nano-structures). Thus, the invention provides an arial density of given capacitance.

Referring now to the drawings, in one example the invention uses an implant 110 (e.g., N-type implant) made through a mask 100 to form the capacitor plate 112 in the bulk silicon region 106 (e.g., P-type bulk silicon), as shown in FIG. 1A. For example, the n-well could have N+ concentrations>519/cm3 implanted in the P-type bulk silicon region 106. This bottom plate 112 provides a low resistance contact that otherwise could not be formed, for example, in the thin active silicon region. Item 108 represents the shallow trench isolation (STI) region and item 102 represents the remaining silicon layer that is co-planar with the STI region 108. Item 104 is the buried oxide (BOX) layer that creates the silicon-on-insulator (SOI) structure shown in the drawings.

Figure 1B:
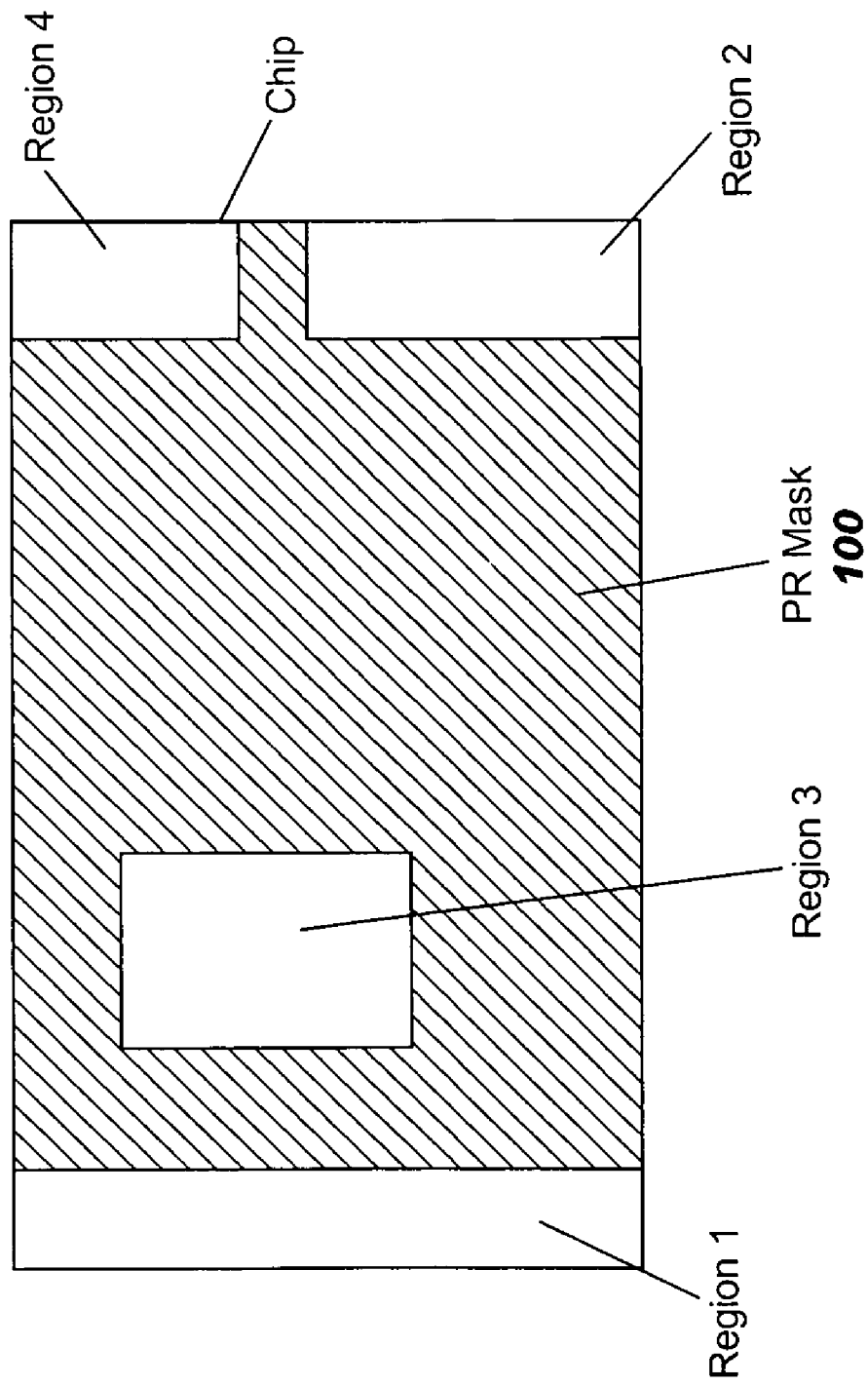
FIG. 1B is a top-view schematic diagram of the mask shown in FIG. 1A.

In one embodiment, the mask 100 has openings (regions 1-4 in FIG. 1B) where the implant 110 will be made. These regions 1-4 are the bulk silicon areas of the chip that are used primarily for structural support and do not contain active switching devices. The remaining areas of the chip covered by the mask 100 are the active areas of the chip. Normally, no structures are formed in the non-active bulk silicon regions 1-4. However, the invention uses the otherwise unused regions 1-4 for the decoupling capacitors. Regions 1 to 4 are arbitrarily chosen for illustration, and could be located in other regions of the chip, and there could be more than (or less than) four distinct regions. In FIG. 1B, the photoresist mask 100 has unprotected regions 1-4 where the chip area is open for implantation. Regions 1, and 2, may be, for example, the I/O and power supply distributions where the capacitor serves in the capacity of decoupling, region 3 may be a memory region wherein the capacitor now serves a storage element, and region 4 may be the Phase Lock Loop Region, where again the capacitor serves in the capacity of decoupling. In all cases, the capacitors are located in the normally non-active, bulk silicon areas of the chip.

If all capacitors are to be interconnected, the mask 100 is not needed, i.e., the implant could be uniform, and through either the shallow trench isolation/BOX regions 108, 104, or through the SI/BOX regions 102, 104. In this situation, the mask 100 is not used to regionalize the plate implant 112, and the plate implant 110 will be common, in the entire bulk region. If this alternative is chosen, then the capacitors would serve as one function, i.e., used either as decoupling, or as a memory storage element. We note for chips with multiple power supplies that the mask 100 is very desirable to allow for an independent plate so as to decouple each power supply uniquely, and not to run into a cross talk situation between (for example) noisy supplies where charge could be transferred from one supply to the next.

Figure 2A:
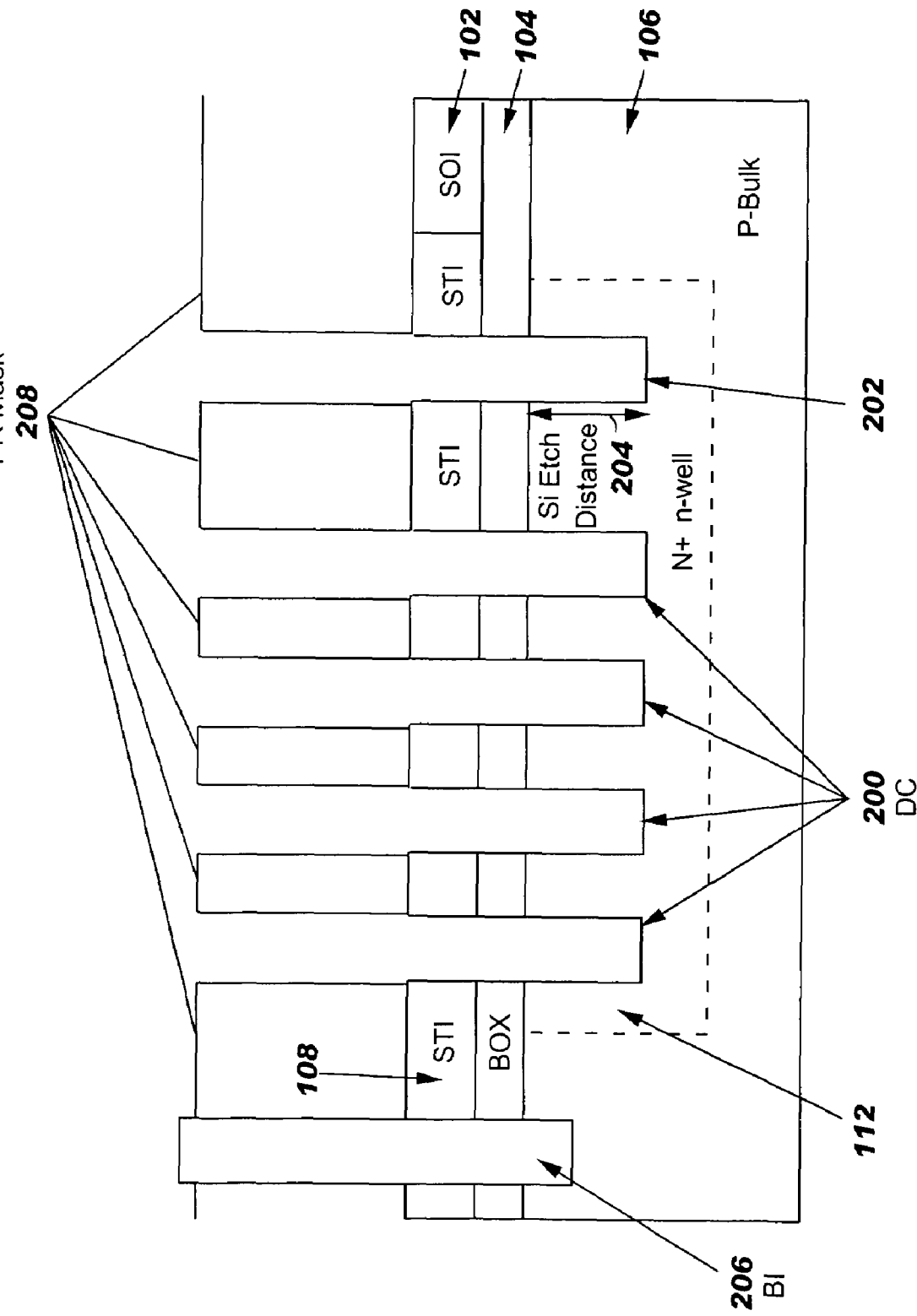

As shown in FIG. 2A, a photoresist mask 208 is used in any common material removal process (such as etching) to form openings for the interdigitated decoupling capacitor (DC) 200, the plate contact 202, and the BI contact 206. BI is a common SOI process module where one makes a contact to the bulk region to hold it to a given potential (usually ground) to avoid unwanted potentials on the bulk that may interfere with the BOX and ultimately the active SOI layer by back-gating. One feature of mask 208 is that it can be used to simultaneously make the N+ plate contacts 202 as shown, a BI contact to the P− Bulk layer 206, and also the source drain contacts above on the active SOI layer. This is especially useful in the case where the contact is tungsten, because polysilicon contacts are not always desirable for source/drain contacts as being too resistive. This mask 208 is intended to replace the conventional BI mask. The formation of the mask image may employ dual tone resist so as to fabricate sub-minimum openings for the interdigitated finger of the decoupling capacitor 200. This material removal process can be performed in stages. For example, the Shallow Trench Isolation (STI) regions 108 and the Buried Oxide region (BOX) 104 can be etched first, and then the openings in the Bulk Silicon region 106 is etched an appropriate distance 204 to ultimately form the structure shown in FIG. 2A.

Figure 2B:
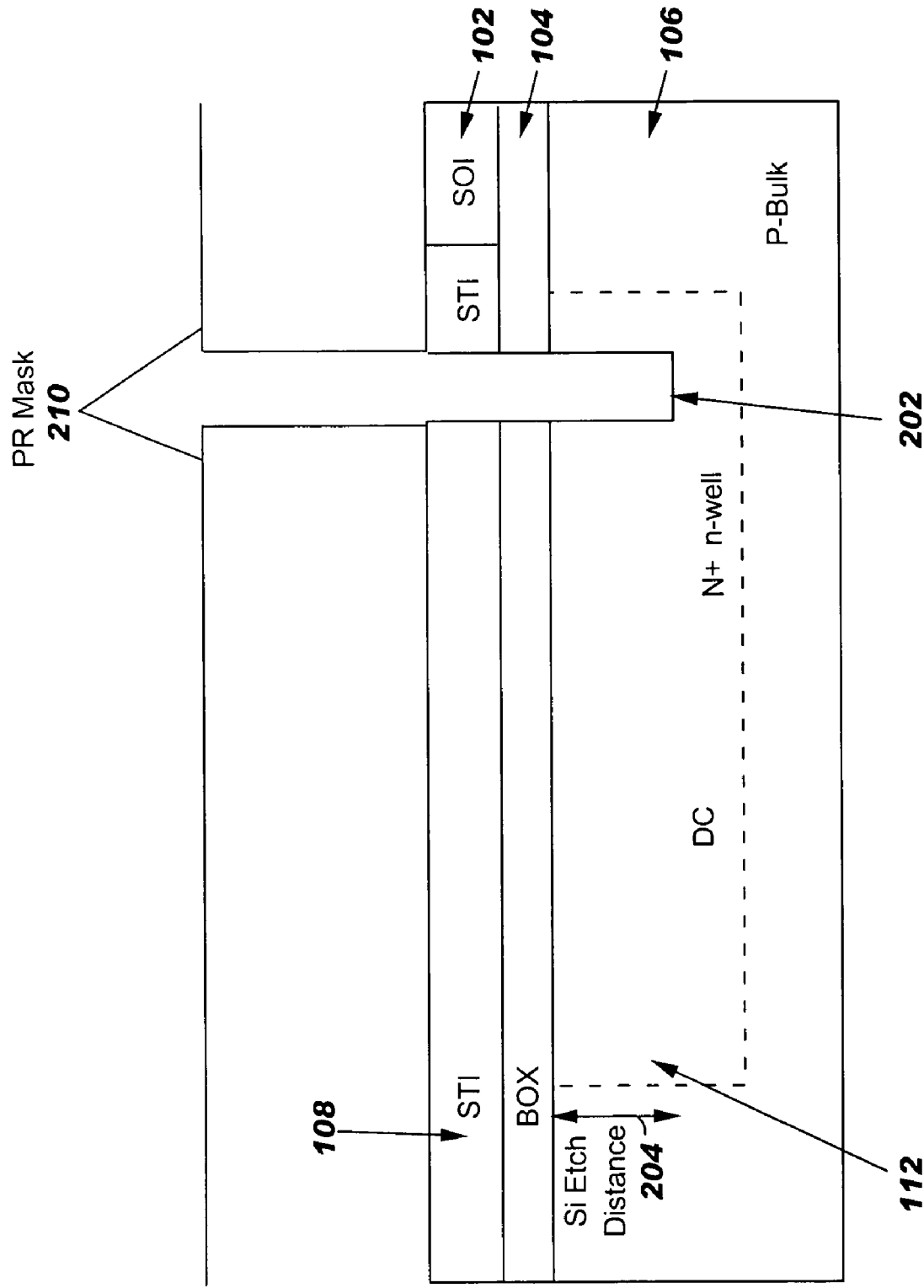

In FIG. 2B, an alternate approach is used. A mask 210 is deployed as shown to etch the plate contact 202. A second mask 212 as seen in FIG. 2C is used to open the capacitor area where the interdigitated trenches are to be etched and protect the remaining areas. Self-assembled nanoparticles 206 are deposited, and a capacitance density that is much greater than a standard photolithographic density is achieved. After the nanoparticles are formed on the STI 108, the same etching processes are used to form the finger openings for the decoupling capacitor 200, as shown in FIG. 2C. In a per unit area, the statistical nature of nanoparticle self-assembly 206 will guarantee a defined capacitance, but the interdigitated trench pitch as designated by the trench to trench distances a, b, and c will vary. After the nanoparticles are formed on the STI 108, the same etching processes are used to form the finger openings for the decoupling capacitor 200, as shown in FIG. 2C.

Figure 3A:
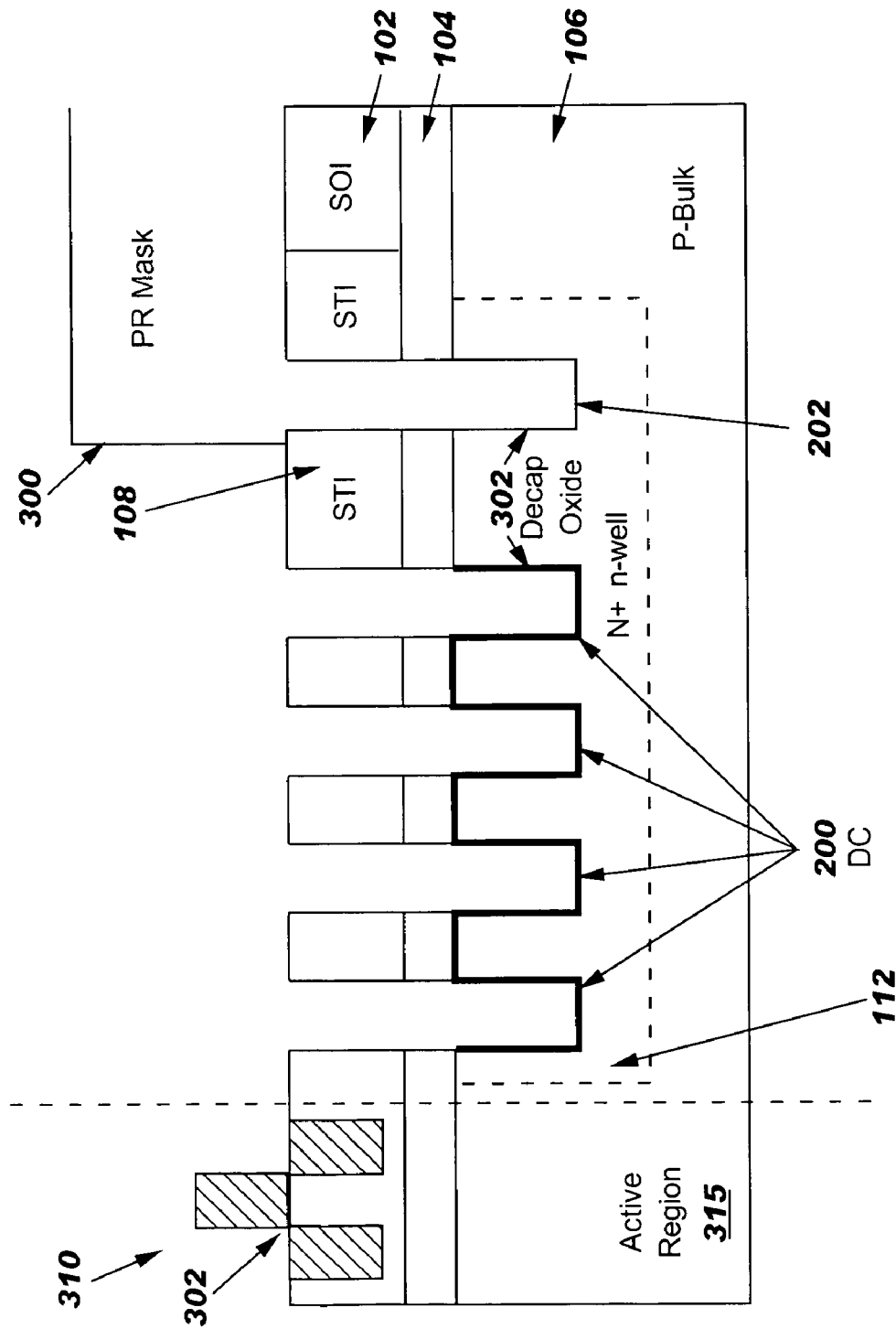
FIGS. 3A-3C are cross-sectional schematic diagrams of a partially completed SOI structure.

In FIG. 3A, the decoupling capacitor oxide 302 (Decap Oxide) is formed, using any common oxidation of silicon process or insulator deposition process. As shown in FIG. 3A, the oxide 302 can be grown in all trenches, both for the plate contact 202 and for the decoupling capacitor 200, as well as for such structures as gate oxides in the active areas 315 where transistors 310 will eventually be formed. The heavy vertical dashed line separates the active area 315 from the bulk silicon region 106 in the drawings. Note that the drawings illustrate a transistor 310 directly adjacent to the bulk silicon region 106; however, this is merely for illustration purposes and to distinguish the active area 315 from the bulk silicon 106, and many designs would not place transistors in this position. The mask 300 is used to protect areas where a planar capacitor could be formed in region 104. Thus, the area used for a fingered capacitor is substantially less than what would be required for a planar capacitor in the same region. The same argument stands for a MIM capacitor that could be formed in the metal layers that subsequently follow above layer 104. In this case the MIM capacitor would significantly reduce the space available for wiring tracks.

Figure 3B:
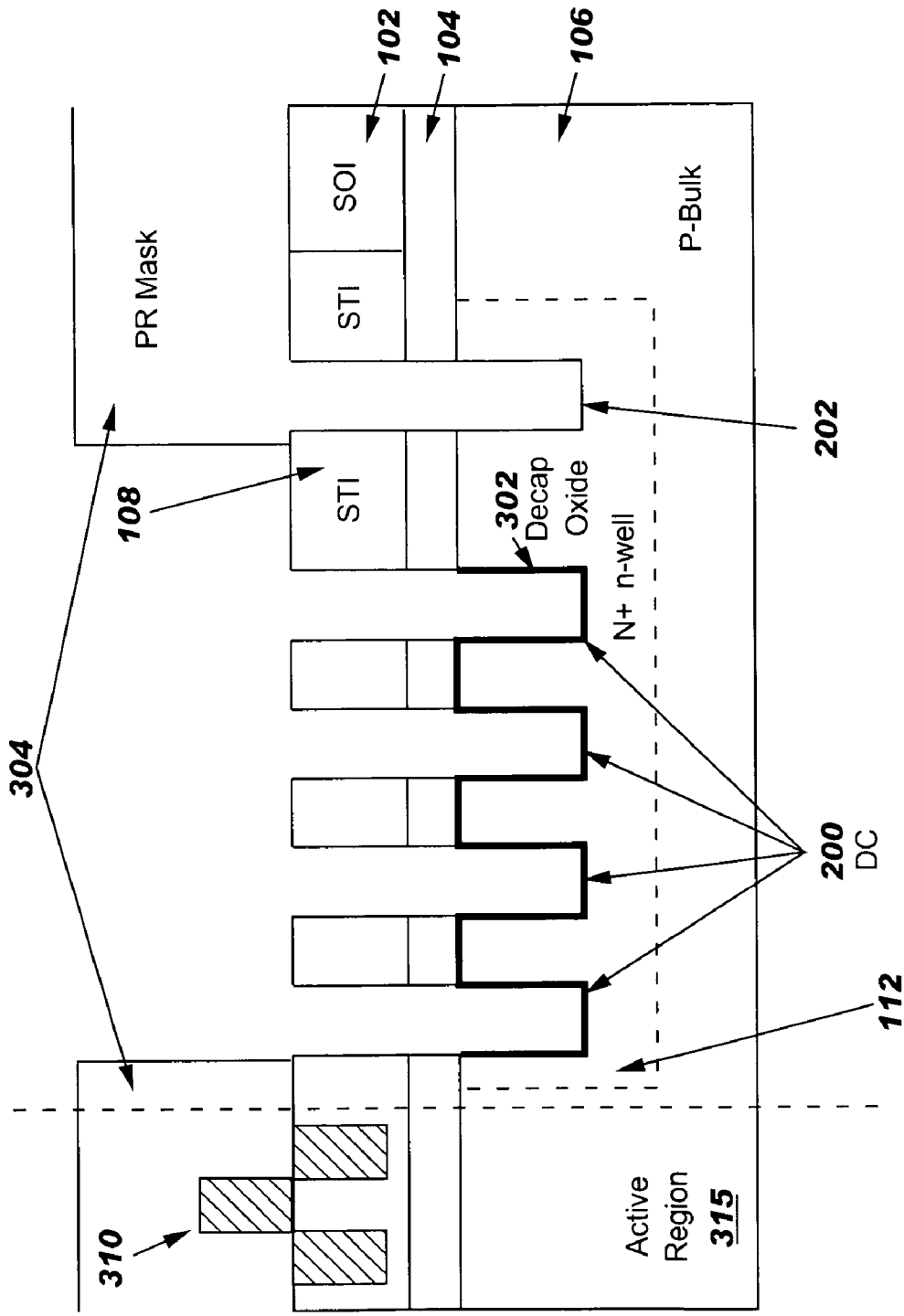
Figure 3C:
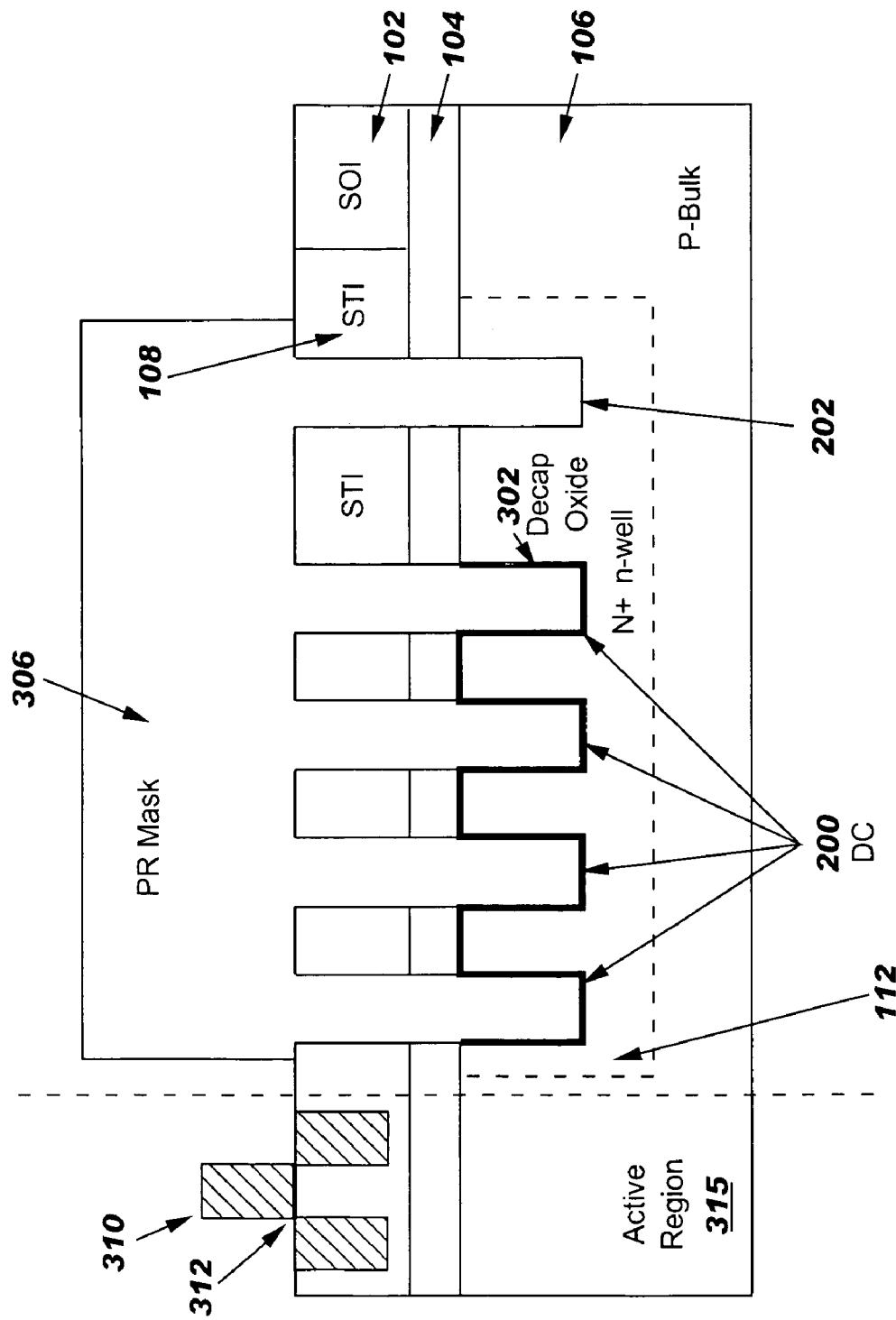

Alternatively, as shown in FIGS. 3B and 3C, the insulator 302 within the capacitive fingers can be formed separately from the insulator 312 of gate oxides in the active area and the lining for the plate contact 202, which allows the insulators 302, 312 to be made of different materials and of different thicknesses. As shown in FIG. 3B, a mask 304 can be used to block oxide growth 302 in the opening for the plate contact and over the SOI active region 315. In FIG. 3C, another mask 306 protects the openings for the fingers of the decoupling capacitor 200 and the plated contact 202 opening, while the second insulator 312 is formed as the gate oxide of the transistor 310. As would be understood by one ordinarily skilled in the art, many different variations of the foregoing processing could be used to form the different insulators 302, 312. For example, the second insulator 312 could be formed before the first insulator 302. Alternatively, the first insulator 302 could be formed in all regions and then selectively removed (using, for example, mask 306) from regions where the second insulator 312 is to be formed. Similarly, one insulator could be formed in all regions and then additional insulator thickness could be formed in selected regions (using, for example, mask 304) to provide different insulator thicknesses.

The decap oxide 302 will normally be made thicker (but there is no reason why it could not be made thinner) than the thickest gate oxide 312 in the active area so that the oxide 302 can handle power supply variation without degrading. This also eliminates DC tunneling currents (which is a significant and unwanted power draw in the 130 and 90 nm and beyond nodes).

Figure 4:
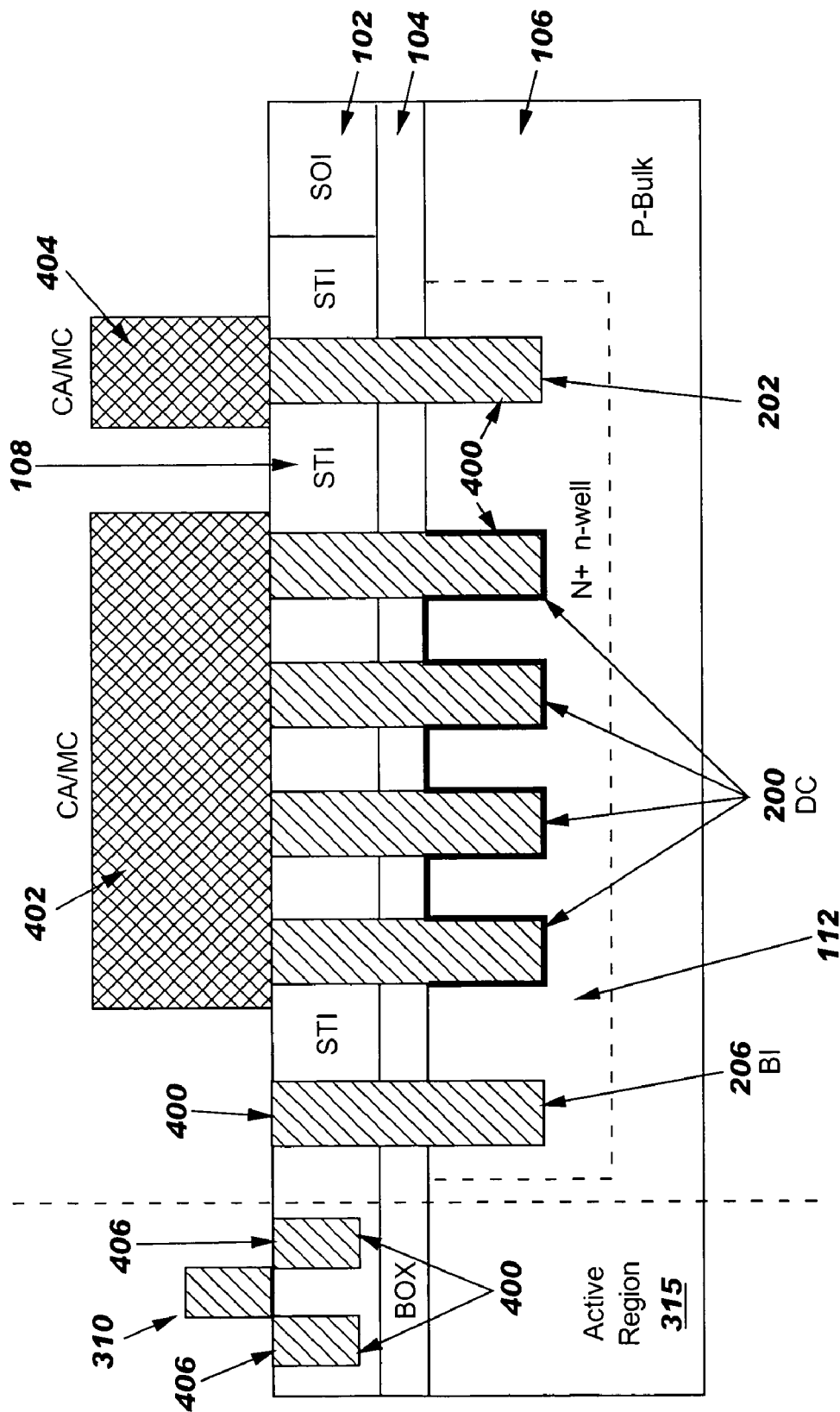
FIG. 4 is a cross-sectional schematic diagram of a partially completed SOI structure.

In FIG. 4, the openings are filled with a conductor 400, such as an in-situ doped n+ polysilicon, intrinsic polysilicon that is later n+ doped through ion implantation, a metal such as tungsten, or an alloy. Again, if tungsten (or polysilicon, etc.) is used, then a simultaneous deposition of conductor for the plate contact 202, the capacitor 200, the device source drain contact regions 406, and the BI contact 206 to the P− region of the substrate can be made, which is a substantial process simplification. Standard contacts (CA/MC) 402, 404 and subsequent interconnects that integrate the capacitor into the back end wiring are then formed using well-known processing techniques. The capacitor area is enhanced by the fingers, and use of the interdigitated fingers reduces the overall area that is required, especially when compared to a planar capacitor or a MiMcap.

Figure 5A:
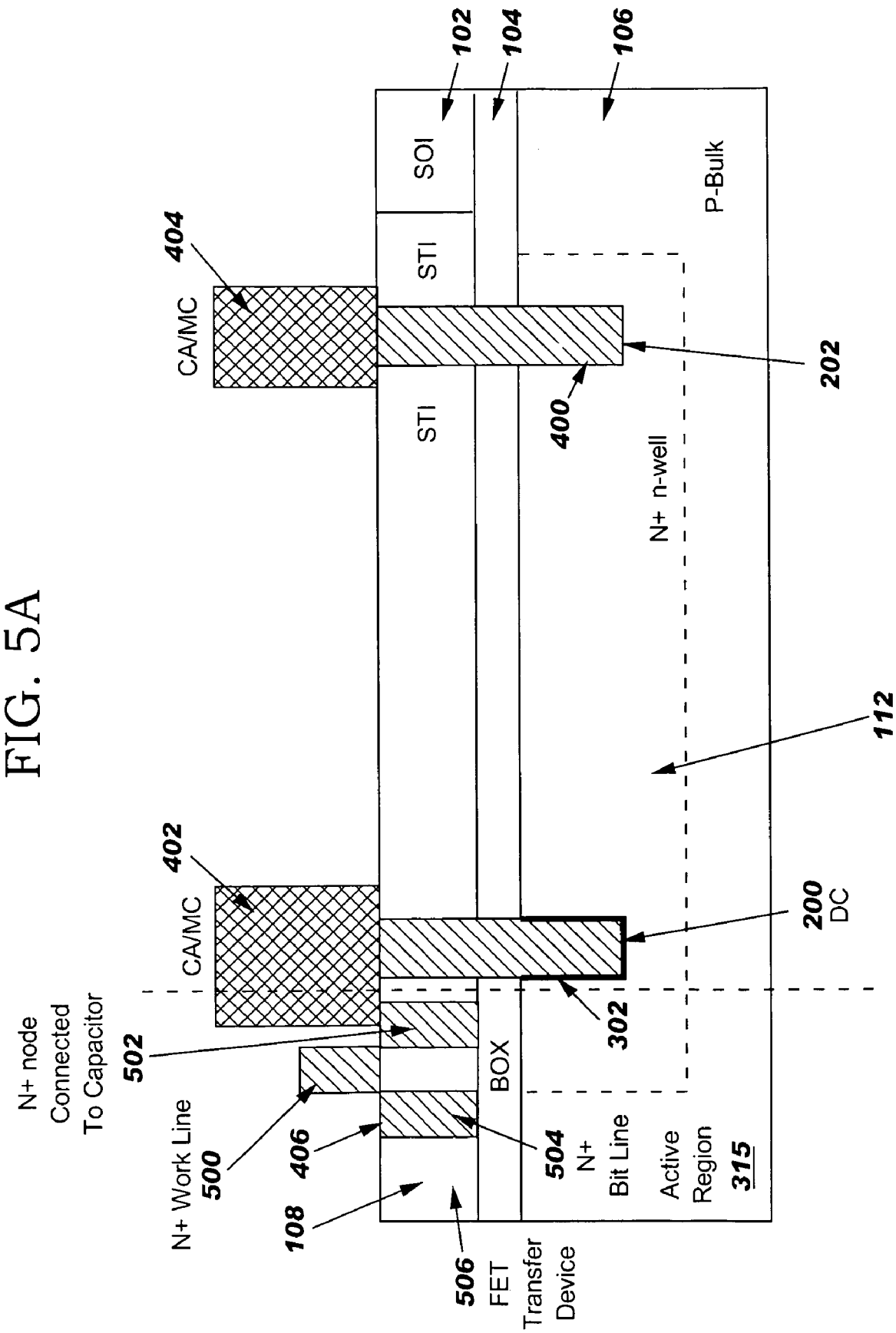
FIGS. 5A-5B are cross-sectional schematic diagrams of a partially completed SOI structure.

Shown in FIG. 5A is an e-DRAM implementation where the decoupling capacitor is now used as a DRAM storage element. It is assumed for simplicity of illustration that, in the e-DRAM environment, only one interdigitated capacitor per transfer device would be required. However, one ordinarily skilled in the art would understand that each transistor could be connected to multiple fingers of a multiple finger decoupling capacitor. Item 500 represents the gate (N+ word line) and items 502, 504 represent the node and bitline connection of the transistor. Therefore, item 504 is shown as the N+ bit line and item 502 is shown as the node of the transistor that is connected to the capacitor 200 through the contact 402 which acts as a strap.

Figure 5B:
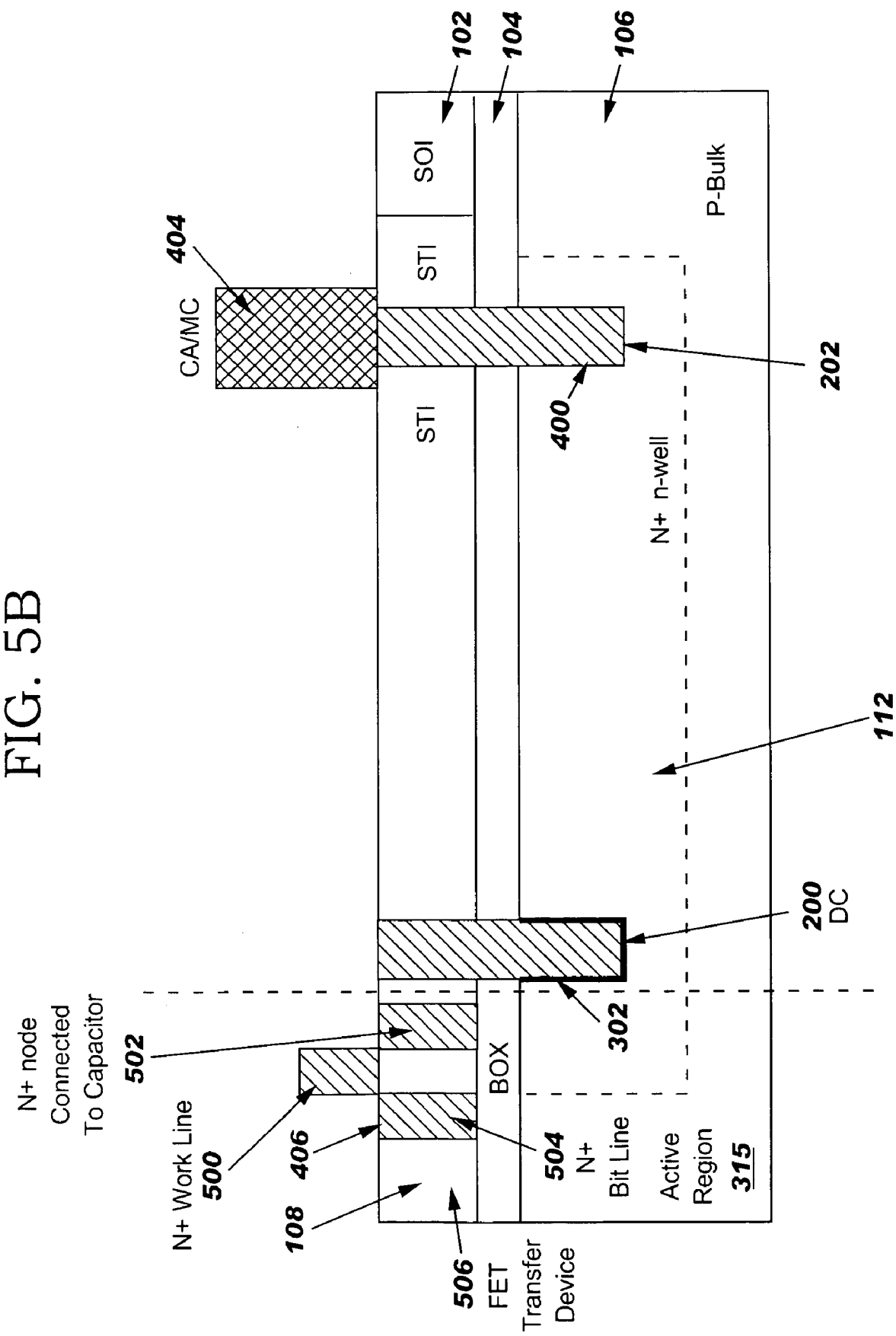

In the structure shown in FIG. 5A, the capacitor 200 is bordered on one side by active silicon 315, as shown by the heavy dashed vertical line. FIG. 5B shows an alternate embodiment where the node diffusion 502 is merged with the capacitor 200 inner plate. The structure shown in FIG. 5B saves space in the design of the cell.

FIGS. 6-9, illustrate a sequence of additional processing steps used to fabricate the DRAM cell capacitor as shown in FIG. 5A or 5B, and for completing the decoupling capacitors as depicted in FIG. 4, when a DRAM cell is required in addition to a decoupling capacitor. Once again, while only a single finger is illustrated for the capacitor 200, a multi-finger capacitor could be used as an alternative. Even in the case of a single finger, significant DRAM cell area advantages exist when contrasted to the formation of a planar DRAM capacitor, amortized for example over a typical array on the order of one to six megabytes.

Figure 6:
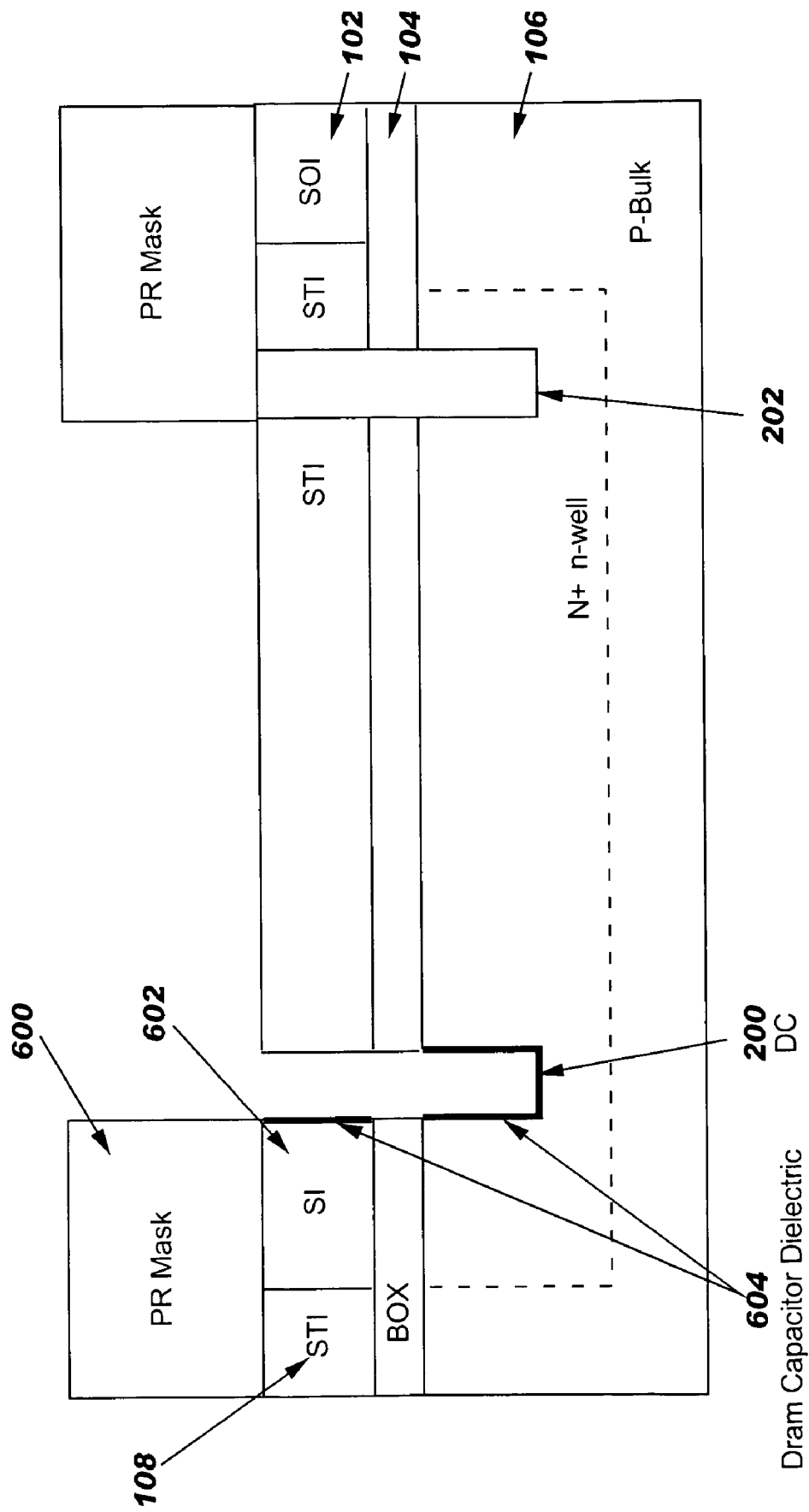
FIG. 6 is a cross-sectional schematic diagram of a partially completed SOI structure.
Figure 7:
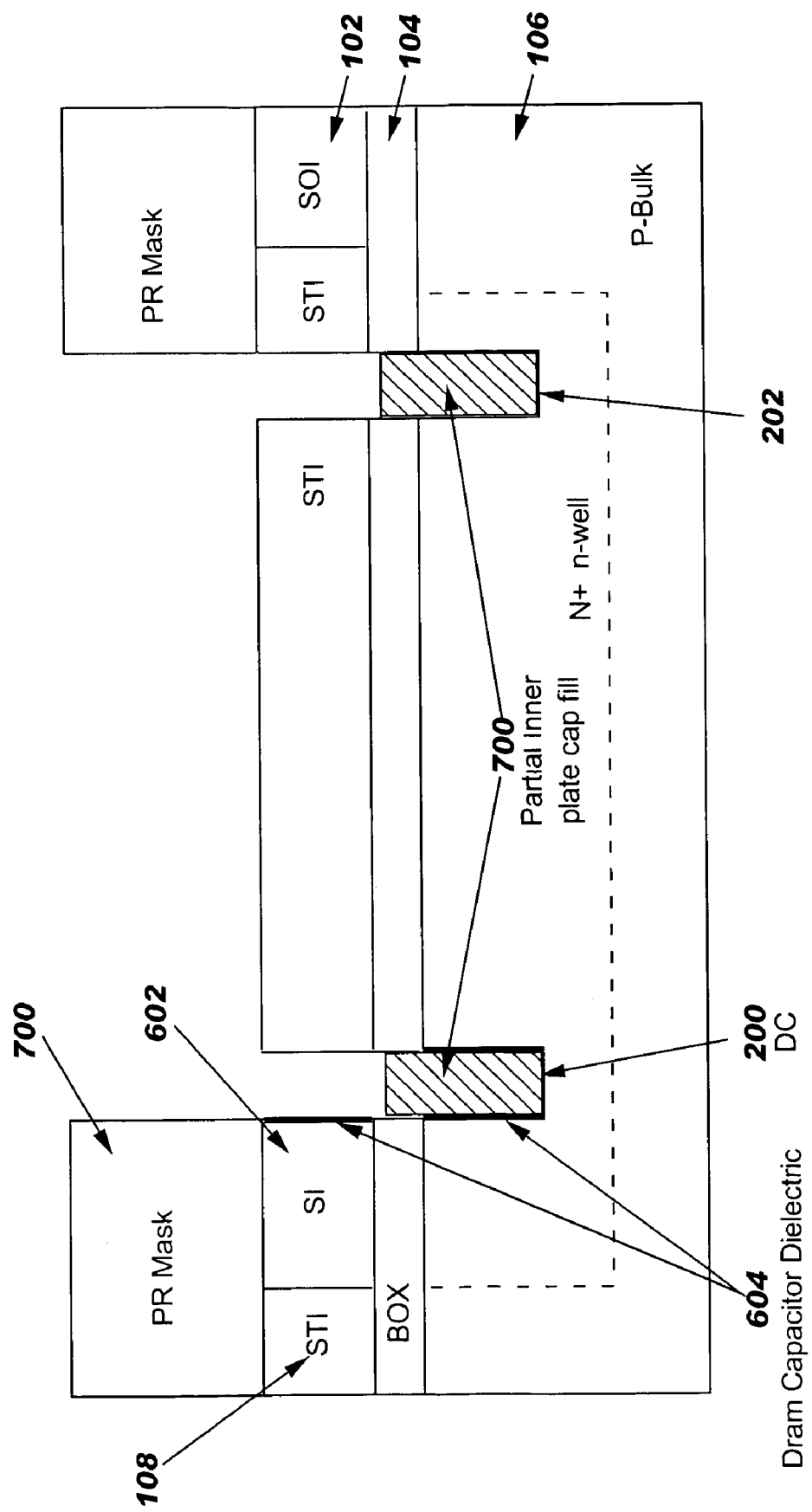
FIG. 7 is a cross-sectional schematic diagram of a partially completed SOI structure.
Figure 8:
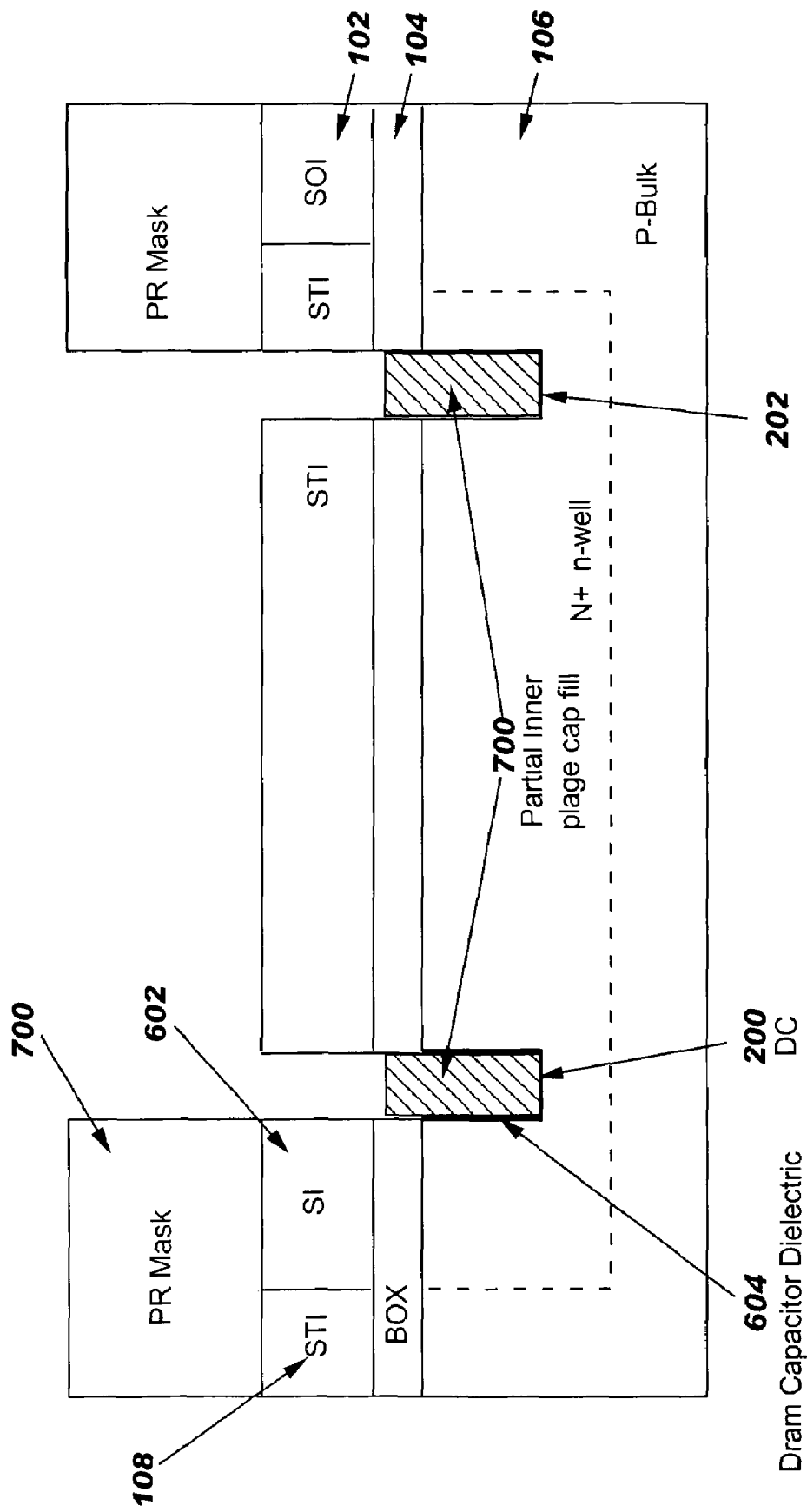
FIG. 8 is a cross-sectional schematic diagram of a partially completed SOI structure.
Figure 9:
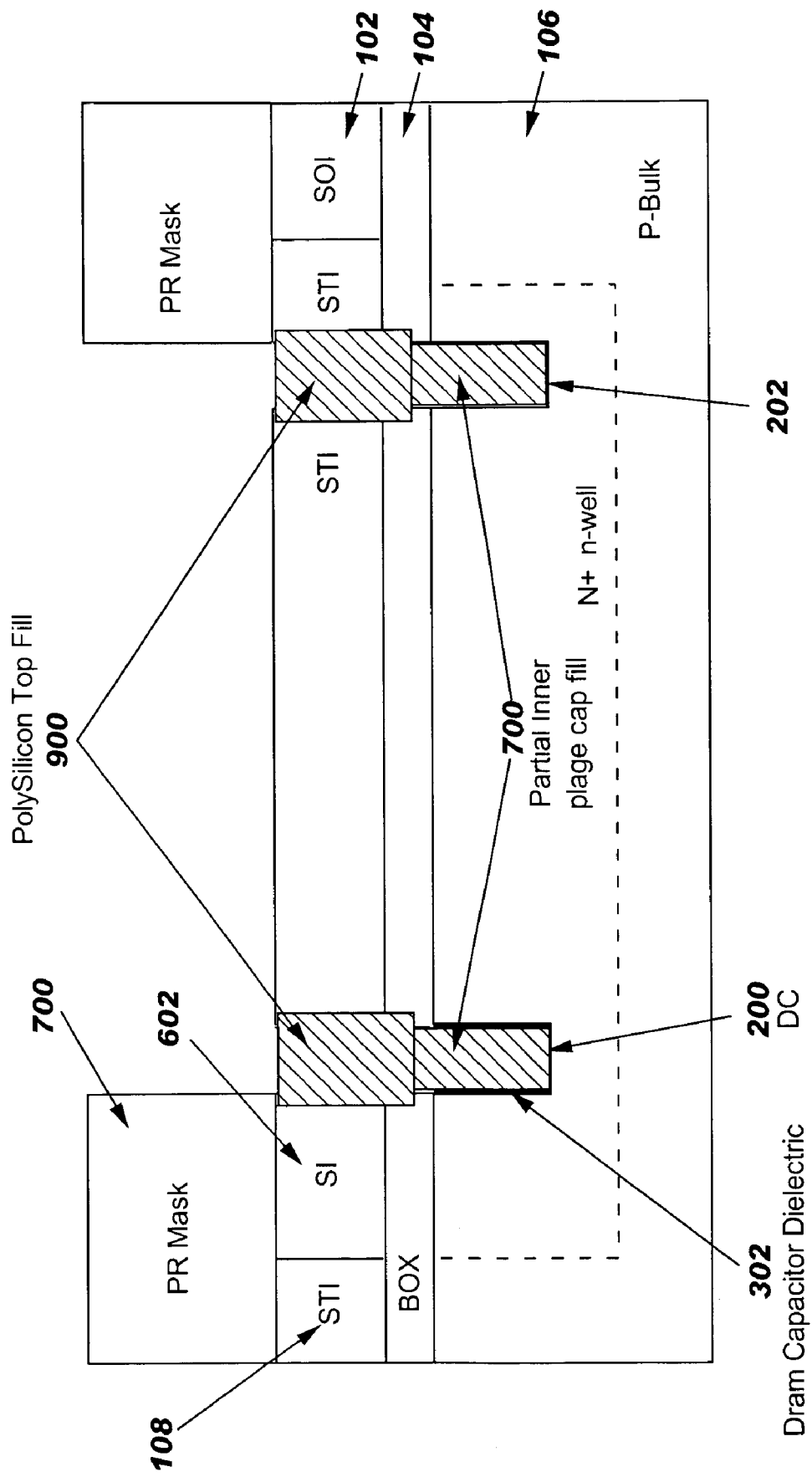
FIG. 9 is a cross-sectional schematic diagram of a partially completed SOI structure.

More specifically, in FIG. 6, a DRAM and/or decoupling capacitor dielectric 604 is grown in regions that are opened by a photoresist mask 600. In this case, the dielectric 604 grows on the sidewall of the exposed silicon island 602. This growth of the silicon island 602 is undesirable and will be removed as shown below. In FIG. 7, a partial fill and etch back of a conductor 700 (e.g., N+ in-situ doped or intrinsic polysilicon) is performed, stopping the etch back process in the BOX region 104. As BOX regions are typically on the order of the silicon thickness, i.e., 300-800 angstroms, such a process step is not critical. As shown in FIG. 8, the unwanted DRAM top dielectric 604 can now be removed without affecting the remaining dielectric 604 that is protected by the conductor 700 that partially fills the finger. In FIG. 9, a second polysilicon top fill 900 is used to complete both the e-Dram capacitor, the trench plate connections (for decoupling capacitors and the e-Dram cell), and the decoupling capacitor top fill. Note that the top fill will be a bit wider than the bottom fill by the width of the dielectric etch (this is overexagerrated in FIG. 9).

Figure 10:
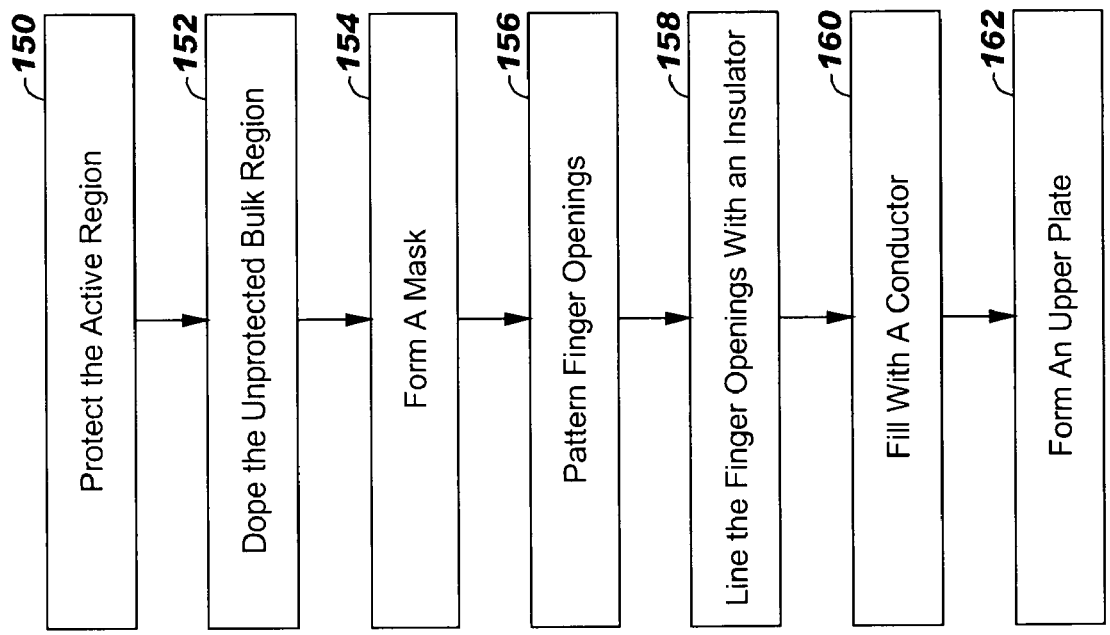
FIG. 10 is a flow diagram illustrating one embodiment of the invention.

The above processing is shown in flowchart form in FIG. 10. As shown in FIG. 10, the invention forms a silicon-on-insulator integrated structure, that comprises at least one active region comprising active devices, and at least one bulk region adapted to provide structural support to the active region. The invention first protects the active region with a first mask 150 and dopes the unprotected bulk region 152 to form a common lower plate. The lower plate may or may not be in common. For example, in a DRAM configuration, the lower plate is in common. In a power supply system with decoupling capacitors, the lower plate can be common, but it does not have to be (i.e., if the decoupling capacitors fail, it may be desirable to have the option to isolate them for example with e-fuses). In a multiple power supply system, the lower plates would not be in common and different capacitor designs could be used for different power supply designs within the same chip.

The invention then forms a second mask used to pattern the capacitive fingers 154. This second mask can be a conventional photolithographic mask or can be formed by depositing self-assembling nanoparticles on the bulk region as the second mask. After this, the finger openings are patterned 156 (e.g., by etching, etc.) into the bulk region through the second mask. The finger openings are then lined with an insulator 158 and filled with a conductor 160 to form the capacitive fingers that extend into the bulk region. These capacitive fingers extend vertically into the bulk region, in a direction perpendicular to the horizontal upper surface of the bulk region. The insulator within the capacitive fingers can be formed separately from gate insulators of transistors in the active area, which allows the insulator to be made of a different material and of a different thickness than the gate insulators.

Next, an upper plate is formed 162. The upper plate is only common within the supply or Dram Cell that it is connecting to. The upper plate is connected to the conductors within the capacitive fingers and can be formed to extend from the decoupling capacitor into the active region. For example, the decoupling capacitor can be connected to a transistor such that the decoupling capacitor comprises a storage element of a dynamic random access memory (DRAM) memory element.

Thus, as shown above, the present invention provides integrated high capacitance structures in the SOI bulk region of an SOI semiconductor structure. The invention allows the capacitor plate contacts to be connected through or to the active SOI region, thus affording standard metal processing to enable the use of the capacitor. The invention positions the capacitive elements completely in the bulk region so as to not have influence to or from the active SI layer. The capacitor can utilize the standard SOI device gate oxide of the transistors that are formed in the active region or a can have unique (thicker or thinner) decoupling capacitor oxide. The capacitor can be fabricated using standard photolithography, or the capacitor can be fabricated using self-assembled minimum feature structures (e.g., nano-structures). Thus, the invention provides an arial density of given capacitance.

While the invention has been described in terms of preferred embodiments, those skilled in the art will recognize that the invention can be practiced with modification within the spirit and scope of the appended claims.

What is claimed is:

1. A method of forming a silicon-on-insulator integrated structure, said structure comprising at least one active region comprising active devices, and at least one bulk region adapted to provide structural support to said active region, said method comprising:
   protecting said active region with a first mask;
   depositing self-assembling nanoparticles on said bulk region as a second mask;
   patterning finger openings into said bulk region through said second mask;
   lining said finger openings with an insulator; and
   filling said finger openings with a conductor to form decoupling capacitive fingers extending into said bulk region, wherein said decoupling capacitive fingers are outside said active region, and
   wherein said filing process simultaneously fills said finger openings, source and drain regions of transistors in said active region, bulk contacts in said bulk region, and plate contacts in said bulk region with said conductor.

2. The method in claim 1, further comprising, before said patterning of said finger openings, doping said bulk region to form a common lower plate in said bulk region below areas where said capacitive fingers will be formed.

3. The method in claim 1, wherein said patterning, lining, and filling process form different types of decoupling capacitors for different types of power supply designs.

4. The method in claim 1, wherein said insulator is formed separately from gate insulators of transistors in said active area.

5. The method in claim 1, wherein said patterning, lining, and filling processes form a decoupling capacitor, said method further comprising:
   connecting said decoupling capacitor to a transistor such that said decoupling capacitor comprises a storage element of a dynamic random access memory (DRAM) memory element.

6. A method of forming a silicon-on-insulator integrated structure, said structure comprising at least one active region comprising active devices, and at least one bulk region adapted to provide structural support to said active region, said method comprising:
   patterning finger openings into said bulk region;
   lining said finger openings with an insulator; and
   simultaneously filling with a conductor said finger openings to form decoupling capacitive fingers extending into said bulk region, source and drain regions of a transistor in said active region, bulk contacts in said bulk region, and plate contacts in said bulk region, and
   wherein said decoupling capacitive fingers are outside said active region.

7. The method in claim 6, further comprising, doping said bulk region to form a common lower plate in said bulk region below areas where said capacitive fingers will be formed.

8. The method in claim 7, wherein said performing said doping said bulk region to form a common lower plate is performed before said patterning of said finger openings.

9. The method in claim 6, wherein said patterning, lining, and filling processes form different types of decoupling capacitors for different types of power supply designs.

10. The method in claim 6, wherein said insulator is formed separately from gate insulators of transistors in said active area.

11. The method in claim 6, wherein said patterning, lining, and filling processes form a decoupling capacitor, said method further comprising:
   connecting said decoupling capacitor to a transistor such that said decoupling capacitor comprises a storage element of a dynamic random access memory (DRAM) memory element.

12. The method in claim 6, further comprising:
   protecting said at least one active region with a first mask; and
   doping said bulk region to form a common lower plate in said bulk region below areas where said capacitive fingers will be formed.

13. The method in claim 12, further comprising:
   depositing a second mask used to pattern said finger openings in said bulk region.

* * * * *